FREQUENCY SHIFT MODULATION RECEIVER

Filed Dec. 3, 1958

INVENTORS
J. E. BOUGHTWOOD
T. M. GRYBOWSKI
BY J. B. Burke
ATTORNEY 3,017,464

FREQUENCY SHIFT MODULATION RECEIVER

John E. Boughtwood, Halesite, N.Y., and Thaddeus M. Grybowski, River Edge, N.J., assignors to The Western Union Telegraph Company, New York, N.Y., a corporation of New York Filed Dec. 3, 1958, Ser. No. 777,884
9 Claims. (Cl. 178—88)

This invention concerns a receiving circuit especially useful in a frequency modulation carrier telegraph system.

According to the invention mark and space signals of different nominal frequencies are applied to two series tuned frequency selective circuits in a low impedance discriminator. These two resonant circuits operate through rectifier bridges to a common output circuit. The output circuit drives a balanced transistorized D.C. amplifier to provide polar signals for operating a polar relay in a receiving circuit. The invention has particular utility in a system of the type described in U.S. Patent No. 2,573,392 to Boughtwood et al.

In the system of the patent a high impedance discriminator is employed with amplifiers using vacuum or thermionic tubes. The discriminator included parallel resonant tuned circuits for producing high voltage outputs to drive the amplifiers. In the present invention the amplifiers use transistors which are essentially low impedance devices. The associated discriminator employed includes two series resonant circuits for producing maximum current outputs responsive to the mark and space signals applied thereto. The discriminator is capable of alignment by adjustment of a cross-coupled capacitor so that the two resonant frequencies of the series tuned circuits are equidistant from a specified channel center frequency. The two series resistant circuits have output rectifiers formed in series aiding relation with respect to each other but in parallel with respetc to the input of the balanced transistor amplifier which operates the polar relay. The amplifier is provided with an adjustable bias compensating resistor network.

It is a principal object of the present invention to provide a low impedance discrimination for detecting FM carrier telegraph signals.

It is a further object to provide a frequency shift receiver including a discriminator for detecting mark and space carrier telegraph signals, in combination with a D.C. transistor amplifier.

It is another object to provide a frequency shift receiver including a discriminator for detecting mark and space FM carrier telegraph signals in combination with a D.C. transistor amplifier for polar signals operating into a polar relay and employing a single grounded battery source of D.C. voltage.

Another object is provision of an FM discriminator for a frequency shift receiver in which a single cross-coupled variable capacitor provides means for tuning two circuits in the discriminator to resonant frequencies equidistant from a specified channel center frequency.

A further object is provision of a low impedance discriminator for FM carrier telegraph signals comprising two similar series resonant circuits tuned, respectively, to frequencies equidistant from a specified channel center frequency and with respective output rectifiers joined in a series aiding relation with respect to each other but in parallel with respect to the input of a balanced transistor amplifier for operating a polar relay, and with a variable capacitor joining corresponding points of the two resonant circuits for simultaneously shifting the nominal tuned frequency of the two resonant circuits, either upwardly or downwardly.

A further object is to provide an adjustable FM discriminator as described for a frequency shift receiver for sending polar signals balanced with respect to a reference potential or ground into a balanced transistor amplifier, in combination with adjustable bias compensating means for the amplifier.

Further objects and advantages of the invention will be apparent from the following detailed description, taken together with the accompanying drawings shown as illustrative embodiment of the invention, in which.

Figure 1:
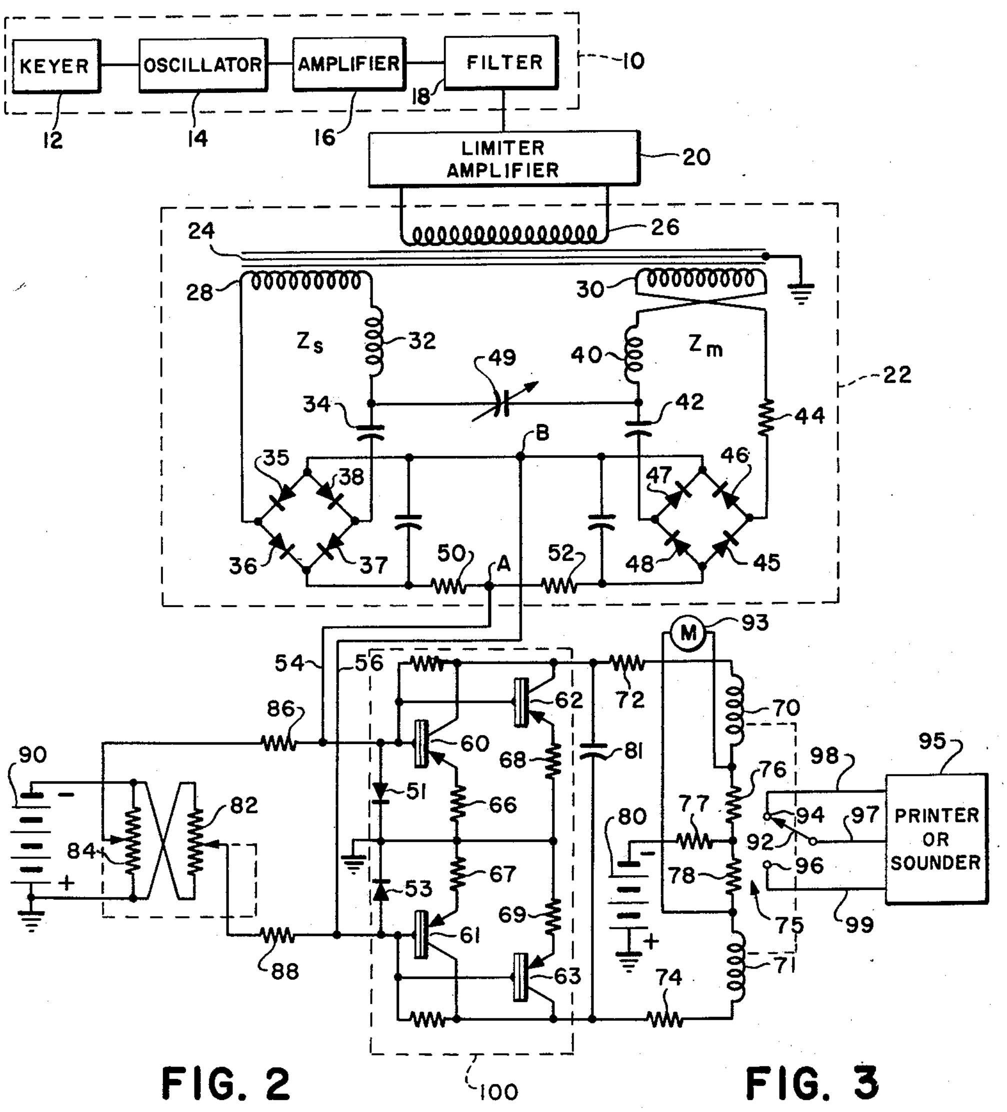
FIG. 1 is a diagrammatic representation of a frequency shift receiver circuit.

Referring to FIG. 1, there is shown a source of mark and space signal frequencies 10. This signal source may include a keyer 12, oscillator 14, amplifier 16 and filter 18. The oscillator provides a signal output which can be varied by the center frequency to produce signals of spacing and marking frequency respectively. The mark and space signals are applied to the buffer amplifier 16 which isolates the oscillator from the following filter 18. Filter 18 passes signals of the marking and spacing frequencies and suppresses all undesired frequencies.

Following the filter is a limiter amplifier 20 in the frequency shift receiver circuit. This amplifier raises the incoming mark and space signals to a predetermined level required to drive the discriminator 22, and removes any amplitude variations from the mark and space signals.

The discriminator 22 includes a transformer 24 having a primary winding 26 and two secondary windings 28, 30. In series with winding 28 is a coil 32 and a capacitor 34. The components 28, 32 and 34 constitute a series resonant circuit $Z_s$. Associated with this series resonant circuit is a rectifier bridge circuit consisting of rectifiers 35—38. In series with winding 30 is a coil 40, a capacitor 42, and a resistor 44. Another rectifier bridge circuit consisting of rectifiers 45–48 is associated with the series resonant circuit $Z_m$ including components 30, 40, 42, 44. The several rectifiers may be conventional diodes.

A variable capacitor 49 connects two corresponding points or midpoints of the two resonant circuits. The capacitor connects the junction of inductance 32 and capacitor 34 with the junction of inductance 40 and capacitor 42. The outputs of the rectifier bridges are connected through resistors 50 and 52 and wires 54, 56 to the input of the D.C. amplifier circuit 100.

The D.C. amplifier circuit includes transistors 60–63. Each transistor base is connected to the input wires. The bases of transistors 60 and 62 are connected to input wire 54, and the bases of transistors 61, 63 are connected to input wires 56. The emitters of all the transistors are connected to ground via resistors 66–69. The outputs of the transistors is taken from their collector electrodes and applied to coils 70, 71 of a polar relay 75 via resistors 72, 74. Coils 70, 71 are connected by resistors 76 and 78 to the negative terminal of a battery 80 via a current limiting resistor 77. The positive terminal of the battery is grounded. A capacitor 81 is connected across the outputs of the transistors.

Two variable resistors 82 and 84 are connected to the bases of the transistors via resistors 86, 88 for adjusting the bias thereon. Another battery 90 provides the necessary bias potential. If desired, the bias potential may be taken off battery 80 and battery 90 may be omitted. Relay 75 has a tongue 92 which moves between contacts 94 and 96 to close either input circuit 97, 98 or input circuit 97, 99 of a telegraph device such as the sounder or printer 95, or to transmit polar signals to a distant telegraph device.

A meter 93 may be connected across resistors 76 and 78 for checking the current flowing in the relay windings.

The discriminator 22 converts the FM marking and spacing signals to polarized D.C. signals. The limiter amplifier serves as the discriminator driver. The output of the amplifier 20 is applied to the primary 26 of transformer 24. Circuit $Z_s$ responds to the spacing frequency signals applied to the transformer to produce a positive output from rectifier bridge 35–38. Circuit $Z_m$ responds to marking frequency signals applied to the transformer to produce a negative output from rectifier bridge 45–48. In addition to having opposite polarity the peaks of the discriminator responses differ in frequency somewhat greater than the predetermined difference between the marking and spacing frequencies. In a preferred system, this may range from 100 to 120 c.p.s.

*Marking signals*

The marking signals may be about 35 c.p.s. or so below the mid-band frequency of the signals generated by oscillator 14. These marking signals are applied across primary 26 of the transformer. Circuit $Z_m$ is tuned close to or slightly below the marking frequency. Circuit $Z_m$ provides a low impedance path for the voltages induced therein. Marking signals of equal amplitude to those applied to circuit $Z_m$ are also induced in circuit $Z_s$. However, this circuit is tuned away from the marking frequency and thus presents a high impedance path to the marking signals. Thus more current flows through the rectifier bridge 45–48 than bridge 35–38. Current flows through resistor 50 and divides, part flowing through resistor 50 and bridge 35–38 and the remainder through amplifier 100 via conductors 54 and 56. As a result point A becomes negative with respect to point B. Current flows from point B through rectifier 53 and the emitter base circuits of transistors 60, 62 to cause these transistors to conduct. The voltage drop across rectifier 53 biases the bases of transistors 61, 63 to render them non-conducting. Current flows from ground through transistors 60, 62 in parallel, resistor 72, relay winding 70 and resistors 76 and 77 to the negative terminal of battery 80 thereby causing the relay tongue 92 to close on contact 94 and close the marking signal circuit 97, 98 of the printer, sounder, or other telegraph device 95, while the spacing signal circuit 97, 99 through contact 96 is open.

*Spacing signals*

The spacing signal frequency may be about 70 c.p.s. or so higher than the marking signal frequency, or about 35 c.p.s. higher than the mid-band frequency of the signals generated by oscillator 14. When these signals are applied to the transformer 24 voltages of equal amplitude are induced in both of circuits $Z_s$ and $Z_m$. Circuit $Z_m$ is tuned away from the spacing frequency and thus presents a higher impedance than circuit $Z_s$ so that more current flows in the rectifier bridge 35–38. The current flows through resistor 50 and divides, part flowing through resistor 52 and bridge 45–48 and the remainder through D.C. amplifier 100 via conductors 54, 56. As a result point A becomes positive with respect to point B. Current flows from the junction point A, through rectifier 51 and the emitter-base circuit of transistors 61, 63, causing these transistors to conduct. The voltage drop across rectifier 51 biases the bases the transistors 60, 62 positive to render them non-conducting. Current flows from ground through transistors 61, 63 in parallel, resistor 74, relay winding 71, and resistors 78 and 77 to the negative terminal of the battery causing the relay tongue 92 to close on its spacing signal contact 96 and close the spacing signal circuit 97, 99. The capacitor 81, relay coils 70, 71, resistors 72, 74 and 76, 78 acts as a low pass filter to exclude carrier or spurious frequencies which might pass through the discriminator rectifier circuits, and to shape the signal current in the relay for minimum distortion.

The transistors are arranged in a push-pull parallel circuit. To control their base bias, the resistors 82 and 84 may be adjusted to vary the proportions of bias current applied to the transistor pairs 60, 62 and 61, 63.

Figure 2:
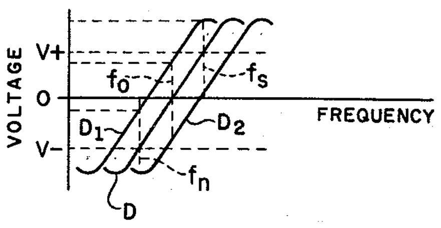
FIG. 2 shows a family of curves illustrating the operation of the discriminator in the receiver circuit.

It will be noted that the mark and space frequence selective circuits $Z_m$ and $Z_s$ are series tuned as above mentioned and operate through their associated respective rectifier bridges into a common output circuit. These two circuits $Z_m$ and $Z_s$ are not tuned precisely to the marking and spacing frequencies respectively but are tuned to frequencies more distant from the channel center frequency in order that the less linear sections of the discriminator characteristic curve will lie outside the channel band and only the substantially linear center portion will be presented to the incoming marking and spacing signals. Referring to FIG. 2 it will be noted from the family of curves $D_1$, $D_2$ and $D_3$ that for the production of unbiased signals, the two halves of the discriminator frequency characteristic should be symmetrical with respect to the center frequency $f_0$. Hence the two tuned circuits $Z_m$ and $Z_s$ should be as nearly identical as possible consistent with the disparate resonant frequencies.

FIG. 2 shows the preferred voltage-frequency characteristic D of the discriminator 22. A substantially straight portion exists between frequencies $f_m$ and $f_s$ on opposite sides of the center frequency $f_0$.

Ordinarily, alignment of a discriminator is a tedious and difficult tuning procedure involving the coordinated adjustment of several different reactive components in order to obtain the symmetry which assures freedom from signal bias. In this discriminator, according to the invention, capacitor 49 which couples two corresponding points on the respective tuned circuits as shown in FIG. 1, may be adjusted to shift the discriminator characteristic from side to side between curve positions $D_1$ and $D_2$ until the optimum location of the discriminator characteristic is obtained at curve position D. This facility greatly simplifies the adjustment procedure for the discriminator in factory and field conditions. The alignment capacitor 49 simultaneously shifts in substantially identical degree the resonant frequencies of both circuits $Z_m$ and $Z_s$, thus preserving symmetry in the discriminator characteristic, while shifting the zero voltage output point of the discriminator to correspond with the center frequency $f_0$ of the incoming signals.

Capacitor 49 when viewed from circuits $Z_s$ is in series with capacitor 42 and other components of circuit $Z_m$ but the capacitors 49 and 42 are effectively in parallel with capacitor 34 of circuit $Z_s$, which tends to lower the resonant frequency of circuit $Z_s$. Similarly when viewed from circuit $Z_m$, capacitor 49 is in series with capacitor 34, while capacitors 34 and 49 are in parallel with capacitor 42 to lower the resonant frequency of circuit $Z_m$. Thus by increasing the capacitance of capacitor 49, the resonant frequencies of both circuits $Z_s$ and $Z_m$ are reduced by substantially identical amounts to shift the discriminator characteristic curve bodily along its frequency axis while retaining all the other characteristics of the curve. It will be noted that the tuning of the circuits $Z_s$ and $Z_m$ insures that in the desired operating frequency range $f_m$–$f_s$ the discriminator characteristic is linear.

Figure 3:
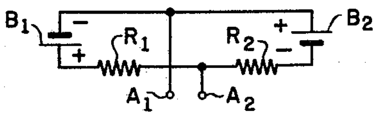
FIG. 3 is a simplified diagram of a current reversal circuit useful in explaining the invention.

The importance of providing for adjustment of the discriminator may be best understood by referring to FIG. 3. There it will be noted that the discriminator characteristic D has zero voltage output at the channel center frequency $f_0$. When a marking signal of frequency $f_m$ is applied to the discriminator there is obtained the desired negative voltage output V−. When a spacing signal of frequency $f_s$ is applied to the discriminator there is obtained the positive voltage output V+. If the discriminator is out of alignment, and has the characteristic $D_1$, for example, then at marking frequency $f_m$, an excessively small negative output voltage is produced by the discriminator, and at spacing frequency $f_s$ the voltage output is excessively positive, while at the channel center frequency $f_0$ a high positive voltage output is produced by the discriminator. Similar undesired voltage outputs are obtained if the discriminator is misaligned to have a characteristic such as shown at $D_2$. The present invention makes it possible to align the discriminator to produce the desired positive and negative voltage outputs V+ and V− at marking and spacing frequencies respectively with no voltage output at the center frequency $f_0$.

The discriminator acts to produce a reversal of current applied to the input of the transistor amplifier circuit, responsive to a change in input to the discriminator from marking to spacing signals and vice versa. FIG. 3 shows in simplified form how this is accomplished. Batteries $B_1$ and $B_2$ represent the voltage developed by the rectifier bridges 35–38 and 45–48 respectively. When both bridges have the same magnitude of output, such as occurs at frequency $f_0$, or mid-way in a frequency shift between mark and space signals, the current delivered to the amplifier, represented by terminals $A_1$, $A_2$ is zero. Resistors $R_1$ and $R_2$ represent the loads furnished by equal resistors such as 50 and 52 in FIG. 1. If one of batteries $B_1$ or $B_2$ produces a larger current output than the other as occurs during the receipt of a mark or space signal, the larger output overrides the smaller to produce a net current output whose polarity is that of the battery of larger output. This occurs because of the opposed disposition of the positive and negative terminals of the batteries.

The discriminator thus acts in effect as a battery reversing switch across the input terminals of the symmetrical polar D.C. amplifier which operates the polar relay 75. Referring to FIG. 1 it will be noted that the outputs of the two rectifier bridges are oppositely poled so that upon receipt of a marking signal point B is rendered positive with respect to point A and, adopting the convention of current flow from positive to negative, it is evident that current will flow from point B through rectifier 53, resistors 66, 68, transistors 60, 62 to point A. This allows current to flow from ground through resistors 66, 68 transistors 60 and 62 in parallel, resistor 72, relay winding 70, resistors 76 and 77 to battery 80. For the incoming spacing signal, the opposite flow of current occurs from point A to point B and with current flowing through transistors 61 and 63. The two resistors 50 and 51 corresponding to resistors $R_1$ and $R_2$ of FIG. 3 should be as nearly equal in resistance value as possible to preserve equality of marking and spacing current. There almost inevitably occurs some residual current flow at frequency $f_0$ due to mismatches which develop in use between various components which should have equal value. This undesired current flow causes biased signals to be received, and can be removed by adjustment of the ganged balancing potentiometers 82, 84. The bias control 82, 84 is also employed to compensate for undesired minor bias currents flowing due to mismatches occurring elsewhere in the system. It does this by passing an opposing current to reduce the undesired bias current to zero.

Resistor 44 in the tuned or resonant circuit $Z_m$ is of such value as to render the characteristics of the circuit identical to that of the tuned circuit $Z_s$ is to obtain as symmetrical a discriminator characteristic as possible as illustrated by curve D in FIG. 2.

Various modifications of the apparatus and circuit arrangements shown and various equivalents will readily occur to those skilled in the art without departing from the invention as defined in the appended claims.

What is claimed is:

1. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, and two oppositely polarized rectifier bridges each having four terminals, a first two of the terminals of one bridge being connected to one of the resonant circuits, the first two terminals of the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between said two different signal frequencies.

2. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, two oppositely polarized rectifier bridges each having four terminals, a first two of the terminals of one bridge being connected to one of the resonant circuits, the first two terminals of the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between said two different signal frequencies, and an amplifier having a low impedance input connected to said output.

3. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, two oppositely polarized rectifier bridges each having four terminals, a first two of the terminals of one bridge being connected to one of the resonant circuits, the first two terminals of the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between said two different signal frequencies, and an amplifier having a low impedance input connected to said output, said amplifier including two pairs of transistors connected in a push-pull parallel circuit.

4. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, two oppositely polarized rectifier bridges each having four terminals, a first two of the terminals of one bridge being connected to one of the resonant circuits, the first two terminals of the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between said two different signal frequencies, an amplifier having a low impedance input connected to said output, said amplifier including two pairs of transistors connected in a push-pull parallel circuit balanced to ground, and grounded bias control means connected to said transistors, said bias control means being effective to pass opposing current to remove any residual bias current occurring after said capacitor is adjusted to produce minimum current output from the discriminator upon application of signals of said mid-channel signal frequency to the discriminator.

5. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, two oppositely polarized rectifier bridges each having four terminals, a first two of the terminals of one bridge being connected to one of the resonant circuits, the first two terminals of the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between two different signal frequencies, an amplifier having a low impedance input connected to said output, said amplifier including two pairs of transistors connected in a push-pull parallel circuit balanced to ground, grounded bias control means connected to said transistors, said bias control means being effective to pass an opposing current to remove any residual bias current occurring after said capacitor is adjusted to produce minimum current output from the discriminator upon application of signals of said mid-channel signal frequency to the discriminator, and a polarized relay operable to either of one of two positions depending upon the polarity of current applied thereto, said amplifier having its output connected to said relay.

6. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, two oppositely polarized rectifier bridges each having four terminals, a first two of the terminals of one bridge being connected to one of the resonant circuits, the first two terminals of the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between two different signal frequencies, an amplifier having a low impedance input connected to said output, said amplifier including two pairs of transistors connected in a push-pull parallel circuit balanced to ground, grounded bias control means connected to said transistors, said bias control means being effective to remove any residual bias current occurring after said capacitor is adjusted to produce minimum current output from the discriminator upon application of signals of said mid-channel signal frequency to the discriminator, and a polarized relay operable to either one of two positions depending upon the polarity of current applied thereto, said amplifier having its output connected to said relay, each of said bridges including two pairs of rectifiers connected in parallel to opposite diagonal terminals of the bridge, with the two rectifiers in each pair disposed in series with each other.

7. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, two oppositely polarized rectifier bridges each having four terminals, a first two of the terminals of one bridge being connected to one of the resonant circuits, the first two terminals at the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between two different signal frequencies, an amplifier having a low impedance input connected to said output, said amplifier including two pairs of transistors connected in a push-pull parallel circuit balanced to ground, grounded bias control means connected to said transistors, said bias control means being effective to pass any opposing current to reduce to zero any residual bias current occurring after said capacitor is adjusted to produce minimum current output from the discriminator upon application of signals of said mid-channel signal frequency to the discriminator, and a polarized relay operable to either one of two positions depending upon the polarity of current applied thereto, said amplifier having its output connected to said relay, said bias control means comprising two ganged potentiometers connected to said transistors.

8. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, two oppositely polarized rectifier bridges each having four terminals, a first two of the terminals of one bridge being connected to one of the resonant circuits, the first two terminals of the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between two different signal frequencies, an amplifier having a low impedance input connected to said output, said amplifier including two pairs of transistors connected in a push-pull parallel circuit balanced to ground, grounded bias control means connected to said transistors, said bias control means being effective to remove any residual bias current occurring after said capacitor is adjusted to produce minimum current output from the discriminator upon application of signals of said channel signal frequency to the discriminator, a polarized relay operable to either one of two positions depending upon the polarity of current applied thereto, said amplifier having its output connected to said relay, said bias control means comprising two ganged potentiometers connected to said transistors, and D.C. current sources having one terminal connected to said relay and said potentiometers, the other terminal of said D.C. current sources being grounded.

9. In a frequency shift signal receiver in combination: a transformer having a primary winding, a discriminator having a linear voltage-frequency characteristic, said discriminator including two series resonant circuits, each of said circuits having a winding mutually coupled to said primary winding, said circuits being tuned to two different signal frequencies, a variable capacitor connecting said circuits and adjusting their resonant frequencies equidistant from a predetermined mid-channel frequency, an output circuit, two oppositely polarized rectifier bridges each having four terminals, a first two of the terminals of one bridge being connected to one of the resonant circuits, the first two terminals of the other bridge being connected to the other resonant circuit, a third terminal of the one bridge being connected to a third terminal of the other bridge, and a fourth terminal of each bridge being connected to said output circuit, said capacitor being effective to position said characteristic so that substantially zero voltage appears at said output upon application of signals of said mid-channel frequency lying midway between two different signal frequencies, an amplifier having a low impedance input connected to said output, said amplifier including two pairs of transistors connected in a push-pull parallel circuit balanced to ground, grounded bias control means connected to said transistors, said bias control means being effective to remove any residual bias current occurring after said capacitor is adjusted to produce minimum current output from the discriminator upon application of signals of said mid-channel signal frequency to the discriminator, a polarized relay operable to either one of two positions depending upon the polarity of current applied thereto, said amplifier having its output connected to said relay, said bias control means comprising two grouped potentiometers connected to said transistor, D.C. current sources having one terminal connected to said relay and said potentiometers, the other terminal of said D.C. current sources being grounded, and a pair of rectifiers connected in opposed relation to ground and each having one terminal connected to a different pair of said transistors.

References Cited in the file of this patent

UNITED STATES PATENTS

| | | |
|---|---|---|
| 1,795,393 | Herman | Mar. 10, 1931 |
| 2,142,218 | Spencer et al. | Jan. 3, 1939 |
| 2,243,417 | Crosby | May 27, 1941 |
| 2,291,369 | Boughtwood | July 28, 1942 |
| 2,376,126 | Crosby | May 15, 1945 |
| 2,424,961 | Bancroft et al. | Aug. 5, 1947 |
| 2,463,402 | Maki | Mar. 1, 1949 |
| 2,654,801 | Atwood | Oct. 6, 1953 |